United States Patent
Pozin et al.

(10) Patent No.: US 10,254,344 B2
(45) Date of Patent: *Apr. 9, 2019

(54) PRIMARY ALKALINE BATTERY WITH INTEGRATED IN-CELL RESISTANCES

(71) Applicant: DURACELL U.S. OPERATIONS, INC., Wilmington, DE (US)

(72) Inventors: Michael Pozin, Brookfield, CT (US); Brianna Rose Derooy, Dorchester, MA (US); Nikolai N. Issaev, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/968,725

(22) Filed: May 1, 2018

(65) Prior Publication Data

US 2018/0246171 A1 Aug. 30, 2018

Related U.S. Application Data (63) Continuation of application No. 14/632,223, filed on Feb. 26, 2015, now Pat. No. 9,958,504.
(Continued)

(51) Int. Cl.
*G01R 31/36* (2006.01)
*H01M 4/50* (2010.01)
(Continued)

(52) U.S. Cl.
CPC ..... *G01R 31/3606* (2013.01); *G01R 31/3662* (2013.01); *H01M 4/42* (2013.01);
(Continued)

(58) Field of Classification Search
CPC . G01R 31/3606; G01R 31/3662; H01M 4/42; H01M 4/50; H01M 6/04; H01M 2004/021
(Continued)

(56) References Cited

U.S. PATENT DOCUMENTS 5,366,832 A 11/1994 Hayashi et al.
6,300,004 B1 10/2001 Tucholski
(Continued)

FOREIGN PATENT DOCUMENTS

CN 1783560 A 6/2006
CN 102856529 A 1/2013
(Continued)

OTHER PUBLICATIONS

International Application No. PCT/US2015/035927, International Preliminary Report on Patentability, dated Dec. 20, 2016.
(Continued)

*Primary Examiner* — Fernando Hidalgo
(74) *Attorney, Agent, or Firm* — Marshall, Gerstein & Borun LLP (57) ABSTRACT

The invention is directed toward a primary AA alkaline battery. The primary AA alkaline battery includes an anode; a cathode; an electrolyte; and a separator between the anode and the cathode. The anode includes an electrochemically active anode material. The cathode includes an electrochemically active cathode material. The electrolyte includes potassium hydroxide. The primary AA alkaline battery has an integrated in-cell ionic resistance ($R_i$) at 22° C. of less than about 39 mΩ. The electrochemically active cathode material includes electrolytic manganese dioxide. The electrolytic manganese dioxide has a specific cathode loading from about 2.9 g/cm³ to about 3.45 g/cm³. The separator has a porosity of greater than 75%.

15 Claims, 3 Drawing Sheets

Related U.S. Application Data (60) Provisional application No. 62/015,276, filed on Jun. 20, 2014.

(51) Int. Cl.
  *H01M 4/42* (2006.01)
  *H01M 6/04* (2006.01)
  *H01M 4/02* (2006.01)

(52) U.S. Cl.
  CPC .............. *H01M 4/50* (2013.01); *H01M 6/04* (2013.01); *H01M 2004/021* (2013.01)

(58) Field of Classification Search
  USPC .......................................................... 702/63
  See application file for complete search history.

(56) References Cited

U.S. PATENT DOCUMENTS

| | | | |
|---|---|---|---|
| 6,670,073 | B2 | 12/2003 | Tucholski et al. |
| RE38,518 | E | 5/2004 | Tucholski |
| 8,343,658 | B2 | 1/2013 | Sumiyawa et al. |
| 9,958,504 | B2 | 5/2018 | Pozin et al. |
| 2003/0170537 | A1 | 9/2003 | Randell |
| 2006/0115731 | A1 | 6/2006 | Oya et al. |
| 2009/0098454 | A1 | 4/2009 | Shimamura et al. |
| 2012/0094159 | A1 | 4/2012 | Okada et al. |
| 2012/0321969 | A1 | 12/2012 | Friesen et al. |
| 2013/0183568 | A1 | 7/2013 | Babinec et al. |
| 2014/0154542 | A1 | 6/2014 | Issaev et al. |
| 2015/0017497 | A1* | 1/2015 | Morris ................... H01M 4/02 429/90 |
| 2015/0030926 | A1 | 1/2015 | Suetsugu et al. |
| 2016/0372748 | A1 | 12/2016 | Nakayama et al. |

FOREIGN PATENT DOCUMENTS

| | | |
|---|---|---|
| JP | 200649797 A | 2/2006 |
| JP | 200993947 A | 4/2009 |
| WO | WO-2012/049720 A1 | 4/2012 |

OTHER PUBLICATIONS

PCT International Search Report with Written Opinion in corresponding International Application PCT/US2015/035927 dated Sep. 2, 2015.

Japanese Patent Application No. 2016-574134, Notification of Reasons for Rejection, dated Nov. 6, 2018.

Chinese Patent Application No. 201580044202.9, First Office Action, dated Nov. 28, 2018 (English Language Translation).

\* cited by examiner

PRIMARY ALKALINE BATTERY WITH INTEGRATED IN-CELL RESISTANCES

CROSS-REFERENCE TO RELATED APPLICATION

This application is a continuation of U.S. patent application Ser. No. 14/632,223, filed Feb. 26, 2015, which claims the benefit under 35 U.S.C. § 119(e) of U.S. provisional patent application Ser. No. 62/015,276, filed Jun. 20, 2014, the entire disclosures of which are hereby incorporated herein by reference.

FIELD OF THE INVENTION

The invention relates to a primary alkaline battery with integrated in-cell resistances and to a method for determining such in-cell integrated resistances.

BACKGROUND OF THE INVENTION

Electrochemical cells, or batteries, are commonly used as electrical energy sources. A battery contains a negative electrode, typically called the anode, and a positive electrode, typically called the cathode. The anode contains an electrochemically active anode material that can be oxidized. The cathode contains an electrochemically active cathode material that can be reduced. The electrochemically active anode material is capable of reducing the electrochemically active cathode material. A separator is disposed between the anode and the cathode. The battery components are disposed in a can, or housing, that is typically made from metal.

When a battery is used as an electrical energy source in an electronic device, electrical contact is made to the anode and the cathode, allowing electrons to flow through the device and permitting the respective oxidation and reduction reactions to occur to provide electrical power to the electronic device. An electrolyte is in contact with the anode, the cathode, and the separator. The electrolyte contains ions that flow through the separator between the anode and cathode to maintain charge balance throughout the battery during discharge.

There is a growing need to make batteries that are better suited to power contemporary electronic devices such as toys; remote controls; audio devices; flashlights; digital cameras and peripheral photography equipment; electronic games; toothbrushes; radios; and clocks. To meet this need, batteries may include higher loading of electrochemically active anode and/or cathode materials to provide increased capacity and service life. Batteries, however, also come in common sizes, such as the AA, AAA, AAAA, C, and D battery sizes, that have fixed external dimensions and constrained internal volumes. The ability to increase electrochemically active material loading alone to achieve better performing batteries is thus limited.

There exists a need to provide an alkaline battery with optimized integrated in-cell resistances to substantially increase overall battery performance, such as power capability and service life.

SUMMARY OF THE INVENTION

In one embodiment, the invention is directed toward a primary AA alkaline battery. The primary AA alkaline battery includes an anode; a cathode; an electrolyte; and a separator between the anode and the cathode. The anode includes an electrochemically active anode material. The cathode includes an electrochemically active cathode material. The electrolyte includes potassium hydroxide. The primary AA alkaline battery has an integrated in-cell ionic resistance ($R_i$) at 22° C. of less than about 39 mΩ. The electrochemically active cathode material includes electrolytic manganese dioxide. The electrolytic manganese dioxide has a specific cathode loading from about 2.9 g/cm$^3$ to about 3.45 g/cm$^3$. The separator has a porosity of greater than 75%.

In another embodiment, the invention is directed toward a method for determining the integrated in-cell resistance of a battery. The method includes the step of providing an electrolyte. The method also includes the step of measuring a resistance of the electrolyte, $R_{el-te(ti)}$, at a temperature $t_i$. The method further includes the step of measuring a resistance of the electrolyte, $R_{el-te(tj)}$, at a temperature $t_j$. The method also includes the step of calculating a ratio of the resistance of the electrolyte, $R_{el-te(ti)}$, at the temperature $t_i$ to the resistance of the electrolyte, $R_{el-te(tj)}$, at the temperature $t_j$ per Equation 6. The method further includes the step of providing a battery including the electrolyte. The method also includes the step of measuring an ohmic resistance of the battery, $R_i$, at the temperature $t_i$. The method includes the step of measuring an ohmic resistance of the battery, $R_j$, at the temperature $t_j$. In addition, the method includes the step of calculating an integrated in-cell electronic resistance, $R_e$, of the battery per Equation 7. The method also includes the step of calculating an integrated in-cell ionic resistance, $R_{i(ti)}$, of the battery at the temperature $t_i$ per Equation 8. The method includes the step of calculating an integrated in-cell ionic resistance, $R_{i(tj)}$, of the battery at the temperature $t_j$ per Equation 8.

BRIEF DESCRIPTION OF THE DRAWINGS

While the specification concludes with claims particularly pointing out and distinctly claiming the subject matter, which is regarded as forming the present invention, it is believed that the invention will be better understood from the following description taken in conjunction with the accompanying drawings.

DETAILED DESCRIPTION OF THE INVENTION

Electrochemical cells, or batteries, may be primary or secondary. Primary batteries are meant to be discharged, e.g., to exhaustion, only once and then discarded. Primary batteries are described, for example, in David Linden, *Handbook of Batteries* (4$^{th}$ ed. 2011). Secondary batteries are intended to be recharged. Secondary batteries may be discharged and recharged many times, e.g., more than fifty times, a hundred times, or more. Secondary batteries are described, for example, in David Linden, *Handbook of Batteries* (4$^{th}$ ed. 2011). Accordingly, batteries may include various electrochemical couples and electrolyte combinations. Although the description and examples provided herein are generally directed towards primary alkaline electrochemical cells, or batteries, it should be appreciated that the invention applies to both primary and secondary batteries of aqueous, nonaqueous, ionic liquid, and solid state systems. Primary and secondary batteries of the aforementioned systems are thus within the scope of this application and the invention is not limited to any particular embodiment.

Figure 1:
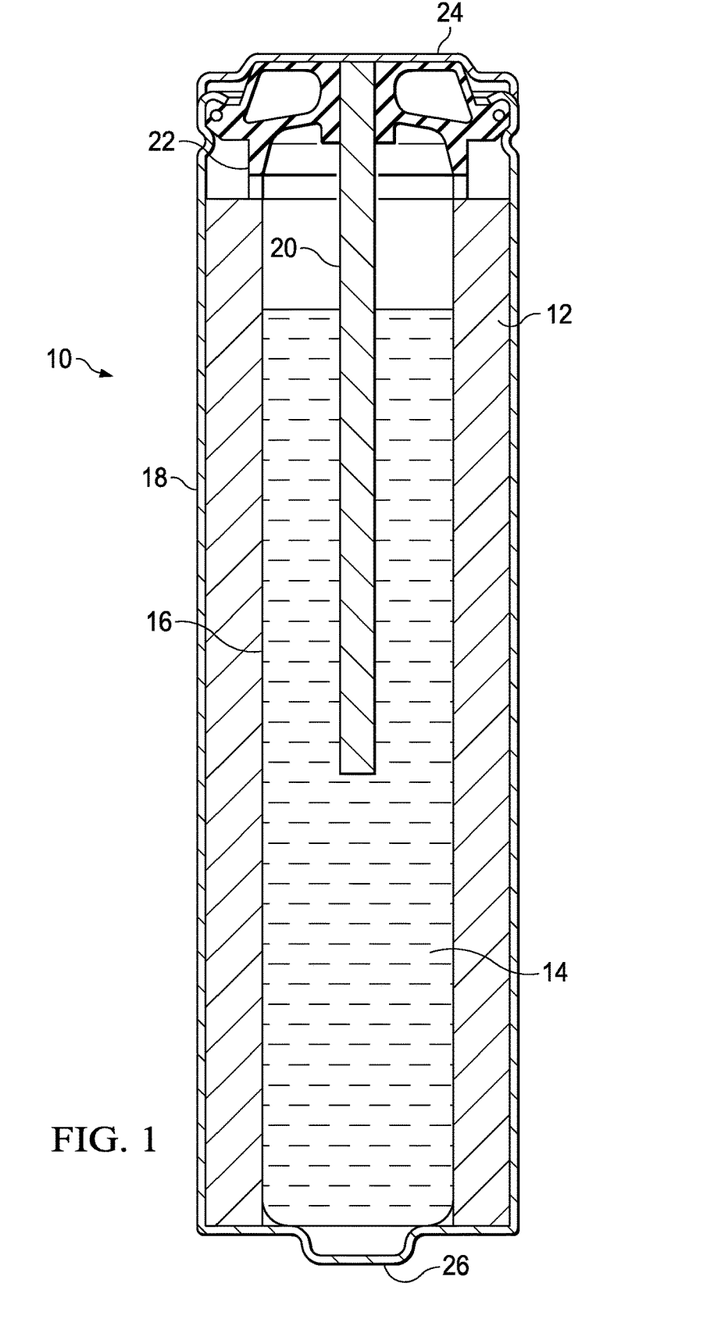
FIG. 1 is a cross-section of a primary alkaline battery with integrated in-cell resistances of the present invention.

Referring to FIG. 1, there is shown a primary alkaline electrochemical cell, or battery, 10 including a cathode 12, an anode 14, a separator 16, and a housing 18. Battery 10 also includes current collector 20, seal 22, and an end cap 24. The end cap 24 serves as the negative terminal of the battery 10. A positive pip 26 is at the opposite end of the battery 10 from the end cap 24. The positive pip 26 may serve as the positive terminal of the battery 10. An electrolytic solution is dispersed throughout the battery 10. The cathode 12, anode 14, separator 16, electrolyte, current collector 20, and seal 22 are contained within the housing 18. Battery 10 can be, for example, a AA, AAA, AAAA, C, or D alkaline battery.

The housing 18 can be of any conventional type of housing commonly used in primary alkaline batteries and can be made of any suitable base material, for example cold-rolled steel or nickel-plated cold-rolled steel. The housing 18 may have a cylindrical shape. The housing 18 may be of any other suitable, non-cylindrical shape. The housing 18, for example, may have a shape comprising at least two parallel plates, such as a rectangular, square, or prismatic shape. The housing 18 may be, for example, deep-drawn from a sheet of the base material, such as cold-rolled steel or nickel-plated steel. The housing 18 may be, for example, drawn into a cylindrical shape. The housing 18 may have at least one open end. The housing 18 may have a closed end and an open end with a sidewall therebetween. The interior surface of the sidewall of the housing 18 may be treated with a material that provides a low electrical-contact resistance between the interior surface of the sidewall of the housing 18 and an electrode, such as the cathode 12. The interior surface of the sidewall of the housing 18 may be plated, e.g., with nickel, cobalt, and/or painted with a carbon-loaded paint to decrease contact resistance between, for example, the internal surface of the sidewall of the housing 18 and the cathode 12.

The current collector 20 may be made into any suitable shape for the particular battery design by any known methods within the art. The current collector 20 may have, for example, a nail-like shape. The current collector 20 may have a columnar body and a head located at one end of the columnar body. The current collector 20 may be made of metal, e.g., zinc, copper, brass, silver, or any other suitable material. The current collector 20 may be optionally plated with tin, zinc, bismuth, indium, or another suitable material presenting a low electrical-contact resistance between the current collector 20 and, for example, the anode 14. The plating material may also exhibit an ability to suppress gas formation when the current collector 20 is contacted by the anode 14.

The seal 22 may be prepared by injection molding a polymer, such as polyamide, polypropylene, polyetherurethane, or the like; a polymer composite; and mixtures thereof into a shape with predetermined dimensions. The seal 22 may be made from, for example, Nylon 6,6; Nylon 6,10; Nylon 6,12; Nylon 11; polypropylene; polyetherurethane; co-polymers; composites; and mixtures thereof. Exemplary injection molding methods include both the cold runner method and the hot runner method. The seal 22 may contain other known functional materials such as a plasticizer, a crystalline nucleating agent, an antioxidant, a mold release agent, a lubricant, and an antistatic agent. The seal 22 may also be coated with a sealant. The seal 22 may be moisturized prior to use within the battery 10. The seal 22, for example, may have a moisture content of from about 1.0 weight percent to about 9.0 weight percent depending upon the seal material. The current collector 20 may be inserted into and through the seal 22.

The end cap 24 may be formed in any shape sufficient to close the respective battery. The end cap 24 may have, for example, a cylindrical or prismatic shape. The end cap 24 may be formed by pressing a material into the desired shape with suitable dimensions. The end cap 24 may be made from any suitable material that will conduct electrons during the discharge of the battery 10. The end cap 24 may be made from, for example, nickel-plated steel or tin-plated steel. The end cap 24 may be electrically connected to the current collector 20. The end cap 24 may, for example, make electrical connection to the current collector 20 by being welded to the current collector 20. The end cap 24 may also include one or more apertures, such as holes, for venting any gas pressure that may build up under the end cap 24 during a gassing event within the battery 10, for example, during deep discharge or reversal of the battery 10 within a device, that may lead to rupturing of the vent.

Cathode 12 includes one or more electrochemically active cathode materials. The electrochemically active cathode material may include manganese oxide, manganese dioxide, electrolytic manganese dioxide (EMD), chemical manganese dioxide (CMD), high power electrolytic manganese dioxide (HP EMD), lambda manganese dioxide, gamma manganese dioxide, beta manganese dioxide, and mixtures thereof. Other electrochemically active cathode materials include, but are not limited to, silver oxide; nickel oxide; nickel oxyhydroxide; copper oxide; copper salts, such as copper iodate; bismuth oxide; high-valence nickel compound; high-valence iron compound; oxygen; and mixtures thereof. The nickel oxide can include nickel hydroxide, nickel oxyhydroxide, cobalt oxyhydroxide-coated nickel oxyhydroxide, delithiated layered lithium nickel oxide, partially delithiated layered nickel oxide, and mixtures thereof. The nickel hydroxide or oxyhydroxide can include beta-nickel oxyhydroxide, gamma-nickel oxyhydroxide, and/or intergrowths of beta-nickel oxyhydroxide and/or gamma-nickel oxyhydroxide. The cobalt oxyhydroxide-coated nickel oxyhydroxide can include cobalt oxyhydroxide-coated beta-nickel oxyhydroxide, cobalt oxyhydroxide-coated gamma-nickel oxyhydroxide, and/or cobalt oxyhydroxide-coated intergrowths of beta-nickel oxyhydroxide and gamma-nickel oxyhydroxide. The high-valence nickel compound may, for example, include tetravalent nickel. The high-valence iron compound may, for example, include hexavalent iron.

Cathode 12 may include a conductive additive, such as carbon particles, and a binder. The carbon particles are included in the cathode to allow the electrons to flow through the cathode. The carbon particles may be graphite, such as expanded graphite and natural graphite; graphene, single-walled nanotubes, multi-walled nanotubes, carbon fibers; carbon nanofibers; and mixtures thereof. It is preferred that the amount of carbon particles in the cathode is relatively low, e.g., less than about 10%, less than about 7.0%, less than about 4.25%, less than about 3.75%, less than about 3.5%, or even less than about 3.25%, for example from about 2.0% to about 3.25%. The lower carbon level enables inclusion of a higher loading of electrochemically active material within the cathode 12 without increasing the volume of the cathode 12 or reducing the void volume of the finished battery 10 (which must be maintained at or above a certain level to prevent internal pressure from rising too high as gas is generated within the cell). Suitable expanded graphite may be, for example, BNB-90 graphite available from TIMCAL Carbon & Graphite (Bodio, Switzerland).

Examples of binders that may be used in the cathode 12 include polyethylene, polyacrylic acid, or a fluorocarbon resin, such as PVDF or PTFE. An example of a polyethylene binder is sold under the trade name COATHYLENE HA-1681 (available from Hoechst or DuPont). Examples of other cathode additives are described in, for example, U.S. Pat. Nos. 5,698,315, 5,919,598, 5,997,775 and 7,351,499.

The amount of electrochemically active cathode material within the cathode 12 may be referred to as the cathode loading. The loading of the cathode 12 may vary depending upon the electrochemically active cathode material used within, and the cell size of, the battery 10. For example, AA batteries with an EMD electrochemically active cathode material may have a cathode loading of at least about 9.0 grams of EMD. The cathode loading may be, for example, at least about 9.5 grams of EMD. The cathode loading may be, for example, from about 9.7 grams to about 11.5 grams of EMD. The cathode loading may be from about 9.7 grams to about 11.0 grams of EMD. The cathode loading may be from about 9.8 grams to about 11.2 grams of EMD. The cathode loading may be from about 9.9 grams to about 11.5 grams of EMD. The cathode loading may be from about 10.4 grams to about 11.5 grams of EMD. For a AAA battery, the cathode loading may be from about 4.0 grams to about 6.0 grams of EMD. For a AAAA battery, the cathode loading may be from about 2.0 grams to about 3.0 grams of EMD. For a C battery, the cathode loading may be from about 25.0 grams to about 29.0 grams of EMD. For a D battery, the cathode loading may be from about 54.0 grams to about 70.0 grams of EMD.

The cathode components, such as electrochemically active cathode material(s), carbon particles, and binder, may be combined with a liquid, such as an aqueous potassium hydroxide electrolyte; blended; and pressed into pellets for use in the manufacture of a finished battery. For optimal cathode pellet processing, it is generally preferred that the cathode material have a moisture level in the range of about 2.5% to about 5%, more preferably about 2.8% to about 4.6%. The pellets, after being placed within a housing during the battery manufacturing process, are typically re-compacted to form a uniform cathode.

It is generally preferred that the cathode 12 be substantially free of nonexpanded graphite. Nonexpanded graphite particles may provide lubricity to the cathode pellet forming equipment. Nonexpanded graphite, however, is significantly less conductive than expanded graphite and it may be necessary to use more nonexpanded graphite in order to obtain the same cathode conductivity of a cathode containing expanded graphite. While not preferred, the cathode may include low levels of unexpanded graphite, however this will compromise the reduction in graphite concentration that can be obtained while maintaining a particular cathode conductivity.

The cathode 12 will have a porosity that may be calculated at the time of cathode manufacture. The porosity of the cathode may be calculated at the time of manufacturing, for example after the cathode pellet processing, since the porosity of the cathode 12 within a battery 10 will change over time due to, inter alia, cathode swelling associated with electrolyte wetting of the cathode and battery discharge. The porosity of the cathode may be calculated as follows. The true density of each solid cathode component may be taken from a reference book, for example *Lange's Handbook of Chemistry* ($16^{th}$ ed. 2005). The solids weight of each of the cathode components are defined by the battery design. The solids weight of each cathode component may be divided by the true density of each cathode component to determine the cathode solids volume. The volume occupied by the cathode within the battery is defined, again, by the battery design. The volume occupied by the cathode may be calculated by a computer-aided design (CAD) program. The porosity may be determined by the following formula:

Cathode Porosity=[1−(cathode solids volume÷cathode volume)]×100

For example, the cathode 12 of a AA battery may include about 10.90 grams of manganese dioxide and about 0.401 grams of graphite (BNB-90) as solids within the cathode 12. The true densities of the manganese dioxide and graphite may be, respectively, about 4.45 $g/cm^3$ and about 2.15 $g/cm^3$. Dividing the weight of the solids by the respective true densities yields a volume occupied by the manganese dioxide of about 2.45 $cm^3$ and by the graphite of about 0.19 $cm^3$. The total solids volume is about 2.64 $cm^3$. The designer may select the volume occupied by the cathode 12 to be about 3.473 $cm^3$. Calculating the cathode porosity per the equation above [1−(2.64 $cm^3$÷3.473 $cm^3$)] yields a cathode porosity of about 0.24, or 24%. The cathode porosity may be from about 15% to about 45% and is preferably between about 22% and about 35%.

The amount of electrochemically active cathode material within a given volume of the cathode 12 may be referred to as the specific cathode loading. The volume occupied by the cathode 12 within the battery 10, as is discussed above, may be defined by the battery design. The volume occupied by the cathode 12 may be calculated by a computer-aided design (CAD) program. The specific cathode loading may be, for example, greater than about 2.9 grams of EMD per cubic centimeter of cathode volume. The specific cathode loading may be, for example, from about 2.9 grams of EMD per cubic centimeter of cathode volume to about 3.45 grams of EMD per cubic centimeter of cathode volume. The specific cathode loading may be, for example, from about 3.0 grams of EMD per cubic centimeter of cathode volume to about 3.36 grams of EMD per cubic centimeter of cathode volume. The specific cathode loading may be, for example, from about 3.10 grams of EMD per cubic centimeter of cathode volume to about 3.25 grams of EMD per cubic centimeter of cathode volume.

The electrochemically active cathode material may consist of particles. The particles of electrochemically active cathode material may have a surface area. The surface area of the particles of electrochemically active cathode material may be determined by any method known in the art. For example, the surface area of the particles of electrochemically active cathode material may be determined using the Brauner-Emmet-Teller (BET) technique. The BET surface area of the particles of electrochemically active cathode material may be, for example, greater than 15 $m^2/g$. The BET surface area of the particles of electrochemically active cathode material may be, for example, from about 15 $m^2/g$ to about 35 $m^2/g$. The BET surface area of the particles of electrochemically active cathode material may be, for example, from about 18 $m^2/g$ to about 28 $m^2/g$. The BET surface area of the particles of electrochemically active cathode material may be, for example, from about 20 $m^2/g$ to about 25 $m^2/g$.

Anode 14 can be formed of at least one electrochemically active anode material, a gelling agent, and minor amounts of additives, such as gassing inhibitor. The electrochemically active anode material may include zinc; cadmium; iron; metal hydride, such as $AB_5$, $AB_2$, and $A_2B_7$; alloys thereof; and mixtures thereof.

The amount of electrochemically active anode material within the anode 14 may be referred to as the anode loading. The loading of the anode 14 may vary depending upon the electrochemically active anode material used within, and the cell size of, the battery 10. For example, AA batteries with a zinc electrochemically active anode material may have an anode loading of at least about 3.3 grams of zinc. The anode loading may be, for example, at least about 4.0, about 4.3, about 4.6 grams, about 5.0 grams, or about 5.5 grams of zinc. AAA batteries, for example, with a zinc electrochemically active anode material may have an anode loading of at least about 1.9 grams of zinc. For example, the anode loading may have at least about 2.0 or about 2.1 grams of zinc. AAAA batteries, for example, with a zinc electrochemically active anode material may have an anode loading of at least about 0.6 grams of zinc. For example, the anode loading may have at least about 0.7 to about 1.0 grams of zinc. C batteries, for example, with a zinc electrochemically active anode material may have an anode loading of at least about 9.5 grams of zinc. For example, the anode loading may have at least about 10.0 to about 15.0 grams of zinc. D batteries, for example, with a zinc electrochemically active anode material may have an anode loading of at least about 19.5 grams of zinc. For example, the anode loading may have at least about 20.0 to about 30.0 grams of zinc.

The electrochemically active anode material may consist of particles. The particles of electrochemically active anode material may have a surface area. The surface area of the particles of electrochemically active anode material may be determined by any method known in the art. For example, the surface area of the particles of electrochemically active anode material may be determined using the Brauner-Emmet-Teller (BET) technique. The BET surface area of the particles of electrochemically active anode material may be, for example, greater than 0.040 $m^2/g$. The BET surface area of the particles of electrochemically active anode material may be, for example, from about 0.0410 $m^2/g$ to about 0.0600 $m^2/g$. The BET surface area of the particles of electrochemically active anode material may be, for example, from about 0.0450 $m^2/g$ to about 0.0550 $m^2/g$. The BET surface area of the particles of electrochemically active anode material may be, for example, from about 0.0490 $m^2/g$ to about 0.0510 $m^2/g$.

The particles of the electrochemically active anode material may have a particle size. The electrochemically active anode material may comprise a Gaussian distribution of particle sizes. For example, the average particle size of electrochemically active anode material may be greater than about 10 μm and less than about 300 μm. The average particle size of electrochemically active anode material may be greater than about 50 μm and less than about 300 μm. The average particle size of electrochemically active anode material may be greater than about 60 μm and less than about 250 μm. The average particle size of electrochemically active anode material may be greater than about 75 μm and less than about 150 μm. The average particle size of electrochemically active anode material may be greater than about 10 μm and less than about 70 μm. The average particle size of electrochemically active anode material may be greater than about 20 μm and less than about 60 μm. The average particle size of electrochemically active anode material may be greater than about 30 μm and less than about 50 μm. The electrochemically active anode material may comprise a multi-modal distribution of particle sizes, for example a bi-modal or tri-modal distribution of particle sizes. A multi-modal distribution refers to a distribution having at least two distinct peaks. Thus, a plot of relative percent of particles as a function of particle size for electrochemically active anode material having a multi-modal distribution of particle sizes would have at least two distinct peaks. One mode of a particle size distribution may comprise about 10% to about 90% of a sample with average particle size in this mode ranging from about 10 μm to about 70 μm. A second mode of a particle size distribution may comprise about 10% to about 90% of the same sample with an average particle size in this mode ranging from about 50 μm to about 300 μm. An example of multi-modal particle size distribution for zinc as the electrochemically active anode material may be a bi-modal distribution where from about 10% to about 35% of the mixture may have an average particle size of between about 10 μm and about 70 μm and the remaining about 65% to about 90% of the mixture may have an average particle size distribution of between about 50 μm and about 300 μm.

Examples of a gelling agent that may be used include a polyacrylic acid; a grafted starch material; a salt of a polyacrylic acid; a carboxymethylcellulose; a salt of a carboxymethylcellulose (e.g., sodium carboxymethylcellulose); or combinations thereof. The anode may include a gassing inhibitor that may include an inorganic material, such as bismuth, tin, or indium. Alternatively, the gassing inhibitor can include an organic compound, such as a phosphate ester, an ionic surfactant or a nonionic surfactant.

The electrolyte may be dispersed throughout the cathode 12, the anode 14 and the separator 16. The electrolyte comprises an ionically conductive component in an aqueous solution. The ionically conductive component may be a hydroxide. The hydroxide may be, for example, sodium hydroxide, potassium hydroxide, lithium hydroxide, cesium hydroxide, and mixtures thereof. The ionically conductive component may also include a salt. The salt may be, for example, zinc chloride, ammonium chloride, magnesium perchlorate, magnesium bromide, and mixtures thereof. The concentration of the ionically conductive component may be selected depending on the battery design and its desired performance. An aqueous alkaline electrolyte may include a hydroxide, as the ionically conductive component, in a solution with water. The concentration of the hydroxide within the electrolyte may be from about 0.25 to about 0.40, or from about 25% to about 40%, on a weight basis of the total electrolyte within the battery 10. For example, the hydroxide concentration of the electrolyte may be from about 0.25 to about 0.32, or from about 25% to about 32%, on a weight basis of the total electrolyte within the battery 10. The aqueous alkaline electrolyte may also include zinc oxide (ZnO) dissolved within it. The ZnO may serve to suppress zinc corrosion within the anode. The concentration of ZnO included within the electrolyte may be less than about 3% by weight of the total electrolyte within the battery 10. The ZnO concentration, for example, may be from about 1% by weight to about 3% by weight of the total electrolyte within the battery 10.

The total weight of the aqueous alkaline electrolyte within a AA alkaline battery, for example, may be from about 3.0 grams to about 4.0 grams. The total weight of the electrolyte within a AA battery preferably may be, for example, from about 3.3 grams to about 3.8 grams. The total weight of the electrolyte within a AA battery may be, for example, from about 3.4 grams to about 3.65 grams. The total weight of the aqueous alkaline electrolyte within a AAA alkaline battery, for example, may be from about 1.0 grams to about 2.0 grams. The total weight of the electrolyte within a AAA battery may be, for example, from about 1.2 grams to about 1.8 grams. The total weight of the electrolyte within a AAA battery may be, for example, from about 1.4 grams to about 1.6 grams.

Separator 16 comprises a material that is wettable or wetted by the electrolyte. A material is said to be wetted by a liquid when the contact angle between the liquid and the surface is less than 90° or when the liquid tends to spread spontaneously across the surface; both conditions normally coexist. Separator 16 may comprise woven or nonwoven paper or fabric. Separator 16 may include a layer of, for example, cellophane combined with a layer of non-woven material. The separator also can include an additional layer of non-woven material. The separator material may be thin. The separator, for example, may have a dry thickness of less than 150 micrometers (microns). The separator, for example, may have a dry thickness of less than 100 microns. The separator preferably has a dry thickness from about 70 microns to about 90 microns, more preferably from about 70 microns to about 75 microns. The separator, for example, may have a wet thickness of less than 185 micrometers (microns). The separator, for example, may have a wet thickness from about 90 microns to about 180 microns. The separator, for example, may have a wet thickness from about 100 microns to about 170 microns. The separator, for example, may have a wet thickness from about 110 microns to about 130 microns. The separator has a basis weight of 40 g/m$^2$ or less. The separator preferably has a basis weight from about, 15 g/m$^2$ to about 40 g/m$^2$, and more preferably from about 20 g/m$^2$ to about 30 g/m$^2$. The separator, for example, may have a density of greater than 1.30 g/cm$^3$. The separator may have a density from about 1.32 g/cm$^3$ to about 1.40 g/cm$^3$. The separator may have a density from about 1.34 g/cm$^3$ to about 1.38 g/cm$^3$. The separator, for example, may have a porosity of greater than about 70%. The separator may have a porosity from about 71% to about 85%. The separator may have a porosity from about 73% to about 80%. The separator may have a porosity from about 75% to about 79%.

Separator 16 may have an air permeability value. The air permeability value of a separator may be characterized by the Sodim air permeability tester, as defined in ISO 2965. The Sodim air permeability tester is designed to measure the air permeability of papers and non-woven materials. The tester measures the volume of gas that passes, at a pressure of 1 kPa, through a predetermined cross-section of the material during one minute. The air permeability value of Separator 16 may be from about 2000 cm$^3$/cm$^2$·min @ 1 kPa to about about 5000 cm$^3$/cm$^2$·min @ 1 kPa. The air permeability value of Separator 16 may be from about 3000 cm$^3$/cm$^2$·min @ 1 kPa to about about 4000 cm$^3$/cm$^2$·min @ 1 kPa. The air permeability value of Separator 16 may be from about 3500 cm$^3$/cm$^2$·min @ 1 kPa to about about 3800 cm$^3$/cm$^2$·min @ 1 kPa.

Area-specific resistance is a measured property of the combined separator and electrolyte that is influenced by separator properties, such as composition, thickness, air permeability, basis weight, and wettability, along with electrolyte properties, such as hydroxide and zincate concentration. The area-specific resistance of a combination of a separator in an alkaline electrolyte may be from about 100 mOhm-cm$^2$ to about 800 mOhm-cm$^2$. The area-specific resistance may be from about 200 mOhm-cm$^2$ to about 500 mOhm-cm$^2$.

Battery discharge performance generally depends on a number of factors. One important factor is the ohmic resistance of the battery which, along with other factors, may affect discharge rate capability and discharge efficiency of the battery. The ohmic resistance of a battery, R, is a combination of an integrated in-cell ionic resistance, $R_i$, and an integrated in-cell electronic resistance, $R_e$, within the battery. The integrated in-cell ionic resistance, $R_i$, may include the ionic resistance of the electrolyte in the pores of the separator, $R_{is}$, as well as the resistance of the electrolyte in the pores of the cathode and the anode that are in proximity of the separator, $R_{ip}$. The resistance of the electrolyte in the pores of the electrode materials of the cathode and the anode that are located inside the porous matrix of the cathode and the anode may affect the integrated in-cell ionic resistance, $R_i$. The integrated in-cell ionic resistance, $R_i$, may represent the effective ionic resistance of the electrolyte in the pores of the separator and the pores of the porous matrix of the cathode and the anode. The resistance of the electrolyte in the pores of the cathode and the anode, $R_{ip}$, will depend on the porosity of the cathode and anode, wettability of the pores, pore distribution, particle size, morphology, wetted surface area, and conductivity of the electrolyte. The integrated in-cell ionic resistance, $R_i$; the integrated in-cell electronic resistance, $R_e$; and the ohmic resistance, R, will impact the battery discharge performance, particularly under high-drain conditions. The discharge performance of a battery may be improved by, for example, minimizing the integrated in-cell ionic resistance, $R_i$; the integrated in-cell electronic resistance, $R_e$; and the ohmic resistance, R, of a battery.

The actual thickness of the separator within an assembled battery is unknown since, for example, the static pressure between the anode and the cathode may exert force on either side of the separator resulting in a compressed thickness. In addition, the static pressure between the anode and the cathode will vary during battery discharge as the density of the cathode active material and the anode active material will change with battery discharge. Also, the particle size and particle size distribution of the cathode components and the anode components may affect the thickness of the separator within an assembled battery. In addition, the particles of the cathode components and the anode components may become embedded within the separator under such conditions. The wettability and compressibility of the separator will also affect the thickness of the separator within the assembled battery. To account for such conditions, an effective separator thickness, $T_{cell}$, that reflects the difference in the integrated in-cell ionic resistance, $R_i$, and the resistance of electrolyte in the pores of the separator, $R_{is}$. The effective separator thickness, $T_{cell}$, may also reflect how effectively the anode is dispensed within the battery and how much void space is created within the anode during the anode dispensing process. The effective separator thickness will also comprise the resistance of the electrolyte in the pores of the cathode and the anode, $R_{ip}$. The effective separator thickness, $T_{cell}$, will impact the battery discharge performance, particularly under high-drain conditions. The discharge performance of a battery may be improved by, for example, minimizing the effective separator thickness, $T_{cell}$.

The integrated in-cell ionic resistance, $R_i$, may vary depending upon the components within, and the size of, the battery 10. The integrated in-cell ionic resistance, $R_i$, may also vary with temperature. For example, primary alkaline AA batteries may have an integrated in-cell ionic resistance, $R_i$, at 22° C. of less than about 39 mΩ. The integrated in-cell ionic resistance, $R_i$, at 22° C. may be from about 15 mΩ to about 39 mΩ. The integrated in-cell ionic resistance, $R_i$, at 22° C. may be from about 20 mΩ to about 36.5 mΩ.

The integrated in-cell electronic resistance, $R_e$, may vary depending upon the components within, and the size of, the battery 10. The integrated in-cell electronic resistance, $R_e$, may also vary with temperature. For example, primary alkaline AA batteries may have an integrated in-cell electronic resistance, $R_e$, at 22° C. of less than about 22 mΩ. The integrated in-cell electronic resistance, $R_e$, at 22° C. may be from about 10 mΩ to about 19 mΩ.

The ohmic resistance, R, may vary depending upon the components within, and the size of, the battery 10. The ohmic resistance, R, may also vary with temperature. For example, primary alkaline AA batteries may have a ohmic resistance, R, at 22° C. of less than about 57 mΩ. The ohmic resistance, R, at 22° C. may be from about 25 mΩ to about 56 mΩ.

The ionic resistance of the electrolyte in the pores of the separator, $R_{is}$, can be estimated by measuring the area-specific resistance of a separator impregnated by a certain electrolyte that will be used within a battery and adjusting the area-specific resistance to an interfacial area of the separator within the battery. A method, however, of measuring the the resistance of the electrolyte in the pores of the cathode and the anode, $R_{is}$, is not known to exist. Similarly, a method of determining the effective separator thickness, $T_{cell}$, is also not known to exist.

The integrated in-cell electronic resistance of the battery, $R_e$, may include the electronic resistance of the combined current path through which electrons may flow during discharge of the battery. The current path may include all metal-metal contacts, both internal and external to the battery; the housing; any metal substrates; any leads in electrical contact with the housing; particle-to-particle contact of, for example, the graphite or zinc; and the like.

In some instances, the electronic resistance of various battery components may be estimated. For example, the electronic resistance of the current collector may be measured. The electronic resistance of other battery components is not easily determined. For example, measuring the electronic resistance of the cathode and the anode is difficult and imprecise. The electronic resistance of the cathode and the anode may be completed using a two or four electrode probe measurement of voltage drop across the cathode and the anode. This technique, however, includes high variability in measurement that may include, for example, between about 20% to about 30% error in the measurement. Thus, this technique may only be used only for estimating the electronic resistance of battery components to which the technique applies.

The ohmic resistance of the battery, R, may be measured by applying a direct current (DC) pulse of short duration to the battery and measuring the drop in battery voltage that corresponds to the application of the DC current. The internal resistance of the battery, R, may be determined by calculating the voltage of the battery that corresponds to the applied current according to Ohm's law. The overall value of the internal resistance of the battery, R, may also be measured utilizing what is commonly referred to as electrochemical impedance. Both techniques, however, may only determine the overall impedance of the battery, R, and may not discern specific resistances that are associated with the various battery components.

There exists a need to independently measure the integrated in-cell ionic resistance, $R_i$, and the integrated in-cell electronic resistance, $R_e$, of a battery. There also exists a need to extract the resistance of the electrolyte in the pores of the cathode and the anode, $R_{ip}$. In addition, there exists a need to estimate the effective thickness of a separator within an assembled battery, $T_{cell}$. The independent characterization of these parameters within a battery may result in optimized battery designs and increased battery discharge performance.

As is discussed above, the ohmic resistance of a battery, R, includes an integrated in-cell ionic resistance component, $R_i$, and an integrated in-cell electronic resistance component, $R_e$. The integrated in-cell ionic resistance, $R_i$, and the integrated in-cell electronic resistance, $R_e$, of a battery may be affected by temperature. The working range of a battery may be from about 0° C. to about 45° C. The integrated in-cell ionic resistance, $R_i$, of a battery within this working range may be greatly affected by changes in temperature. The integrated in-cell electronic resistance, $R_e$, of a battery within this working range of a battery is not, however, greatly affected by changes in temperature.

The temperature dependence of the integrated in-cell ionic resistance may be utilized to evaluate the integrated in-cell ionic resistance, $R_i$, within a battery. It may be assumed that the integrated in-cell electronic resistance, $R_e$, of a battery within a given temperature range remains constant according to Equation 1 below:

$$R_{e(ti)} = R_{e(tj)} = R_e \qquad (1)$$

where $R_{e(ti)}$ is the integrated in-cell electronic resistance, in Ohms (Ω), of the battery at a temperature, $t_i$, in degrees Celsius (° C.); $R_{e(tj)}$ is the integrated in-cell electronic resistance, in Ohms (Ω), of the battery at a different temperature, in degrees Celsius (° C.); and $R_e$ is the constant integrated in-cell electronic resistance, in Ohms (Ω), of the battery at any temperature ranging from $t_i$ to $t_j$.

It may also be assumed that ratio of the integrated in-cell ionic resistances of the battery at different temperatures is equal to the ratio of the two electrolyte resistances of the battery at the two different temperatures according to Equation 2 below:

$$\frac{R_{el-te(ti)}}{R_{el-te(tj)}} = \frac{R_{i(ti)}}{R_{i(tj)}} \qquad (2)$$

where $R_{el-te(ti)}$ is the resistivity of the electrolyte within the battery, in Ohms (Ω), at a temperature, $t_i$, in degrees Celsius (° C.); $R_{el-te(tj)}$, is the resistivity of the electrolyte within the battery, in Ohms (Ω), at a different temperature, $t_j$, in degrees Celsius (° C.); $R_{i(ti)}$ is the integrated in-cell ionic resistance of the battery, in Ohms (Ω), at a temperature, $t_i$, in degrees Celsius (° C.); and $R_{i(tj)}$ is the integrated in-cell ionic resistance of the battery, in Ohms (Ω), at a different temperature, $t_j$, in degrees Celsius (° C.).

The ohmic resistance of the battery, R, at temperatures $t_i$ and $t_j$ respectively, may be expressed according to Equation 3 and Equation 4 below:

$$R_{ti} = R_{e(ti)} + R_{i(ti)} \qquad (3)$$

$$R_{tj} = R_{e(tj)} + R_{i(tj)} \qquad (4)$$

where $R_{ti}$ is the ohmic resistance within the battery, in Ohms (Ω), at a temperature, $t_i$, in degrees Celsius (° C.) and $R_{tj}$ is the ohmic resistance within the battery, in Ohms (Ω), at a different temperature, $t_j$, in degrees Celsius (° C.).

Equation 2, utilizing Equations 1, 3, and 4, may be rewritten as Equation 5 below:

$$\frac{R_{el-te(ti)}}{R_{el-te(tj)}} = \frac{R_{ti} - R_e}{R_{tj} - R_e} \quad (5)$$

The ratio of the resistivity of the electrolyte within the battery at temperature $t_i$ to the resistivity of the electrolyte within the battery at temperature $t_j$ may be defined as X and may be written as Equation 6 below:

$$X = \frac{R_{el-te(ti)}}{R_{el-te(tj)}} \quad (6)$$

Equation 5, utilizing Equation 6, may be rewritten as Equation 7 below:

$$R_e = \frac{R_{ti} - X \cdot R_{tj}}{1 - X} \quad (7)$$

The ohmic impedance of a battery may be measured at specific temperatures within a given temperature range using, for example, a Solartron Impedance Analyzer. In addition, the resistivity of the electrolyte at a given temperature may be experimentally determined using, for example, a conductivity cell. The integrated in-cell electronic resistances of the battery at the specific temperatures may be determined using Equation (7) above along with the experimentally determined ohmic impedances and resistivity of the battery at the specific temperatures. The integrated in-cell ionic resistance of the battery at a specific temperature within the given temperature range may be written as Equation (8) below:

$$R_{i(ti)} = R_{(ti)} - R_e \quad (8)$$

The capacitance of a battery, $C_p$, at a given temperature may also be included within the above analysis. The capacitance of the battery, $C_p$, at a given temperature may be measured utilizing, for example, a Solartron impedance analyzer. The capacitance of the battery at a given temperature may be extracted from the Nyquist plots that result from such analysis. The capacitance of the battery, $C_p$, at a given temperature will be proportional to the electrochemically active surface area of the cathode and the anode. The capacitance of the battery, $C_p$, at a given temperature may be treated as a compliment to the resistance of the electrolyte in the pores of the cathode and the anode that are in proximity of the separator.

The integrated in-cell ionic resistance, $R_i$, of the battery that is calculated using Equation 8 may be compared within the area-specific resistance of the separator/electrolyte combination that is normalized to the anode-to-cathode interfacial area of the battery. The difference between the integrated in-cell ionic resistance, $R_i$, of the battery and the normalized area-specific resistance of the separator/electrolyte combination may provide information for characterizing the resistance of the electrolyte in the pores of the cathode and the anode that are in proximity of the separator, $R_{ip}$, or to determine the effective thickness of the separator within the battery, $T_{cell}$. The battery designer may optimize the battery design and the assembly battery assembly process to subsequently improve battery discharge performance, or determine the efficiency of the anode dispensing process, by measuring and adjusting, either alone or in combination, the integrated in-cell electronic resistance, $R_e$; the integrated in-cell ionic resistance, $R_i$; the integrated in-cell ionic resistance of the electrolyte in the pores of the separator, $R_{is}$, or area-specific resistance; the resistance of the electrolyte in the pores of the cathode and the anode that are in proximity of the separator, $R_{ip}$; the effective thickness of the separator of a battery design, $T_{cell}$; and the capacitance of the battery.

The above techniques for evaluating and optimizing the design of a battery may be completed at various states of battery discharge or charge. The above techniques also apply to evaluating and optimizing the design of a battery at various states of storage. Determining the various parameters described above at various states of battery discharge, battery charge, and battery storage may also help optimize battery discharge performance and battery reliability.

Figure 2:
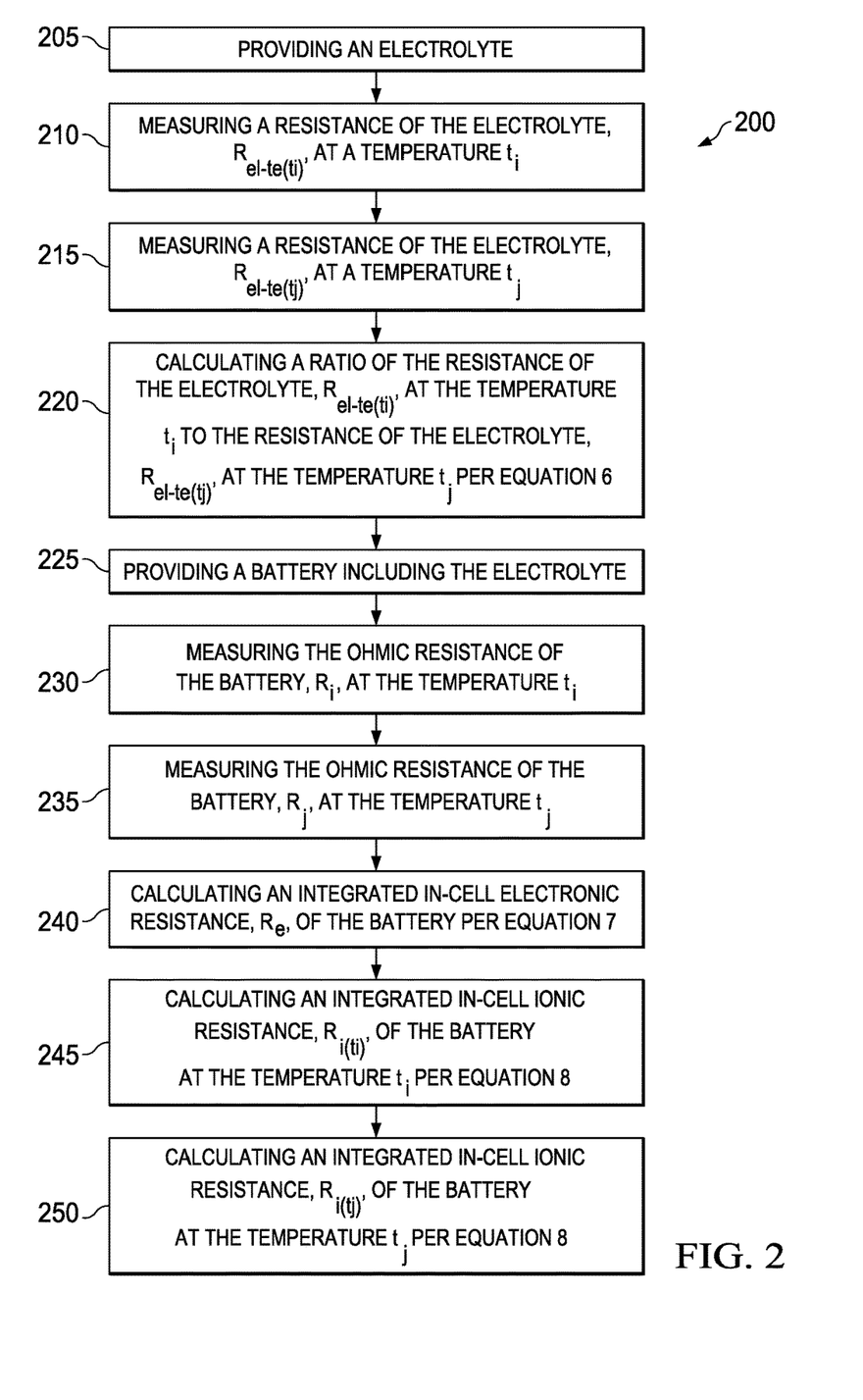
FIG. 2 is a process flow diagram of an embodiment of a method for calculating integrated in-cell resistances of the present invention.

Referring to FIG. 2, a method for determining the integrated in-cell resistances for a battery (200) is shown. The method includes providing an electrolyte (205). The method also includes the step of measuring a resistance of the electrolyte, $R_{el-te(ti)}$, at a temperature $t_i$ (210). The method also includes the step of measuring a resistance of the electrolyte, $R_{el-te(tj)}$, at a temperature $t_j$ (215). The method also includes the step of calculating the ratio of the resistance of the electrolyte, $R_{el-te(ti)}$, at a temperature $t_i$ to the resistance of the electrolyte, $R_{el-te(tj)}$, at a temperature $t_j$ per Equation 6 (220). The method also includes the step of providing a battery including the electrolyte (225). The method also includes the step of measuring the ohmic resistance of the battery, $R_i$, at the temperature $t_i$ (230). The method also includes the step of measuring the ohmic resistance of the battery, $R_j$, at the temperature $t_j$ (235). The method also includes the step of calculating the integrated in-cell electronic resistance, $R_e$, of the battery per Equation 7 (240). The method also includes the step of calculating the integrated in-cell ionic resistance, $R_{i(ti)}$, of the battery at the temperature $t_i$ per Equation 8 (245). The method also includes the step of calculating the integrated in-cell ionic resistance, $R_{i(tj)}$, of the battery at the temperature $t_j$ per Equation 8 (250).

Figure 3:
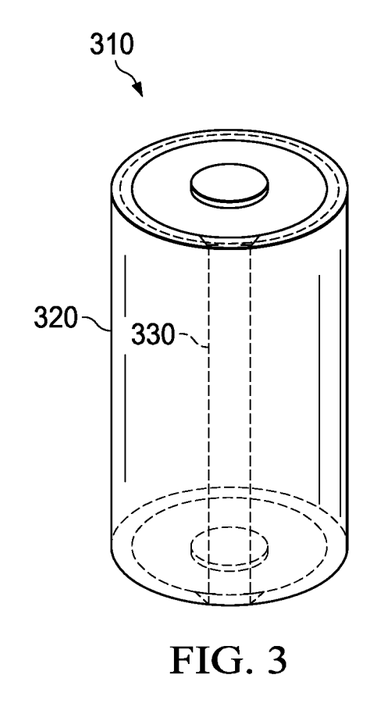
FIG. 3 is a perspective view of a primary alkaline battery with integrated in-cell resistances of the present invention including a voltage indicator.

Referring to FIG. 3, a battery 310 is shown including a label 320 that has a voltage indicator, or tester, 330 incorporated within it. The label 320 may be a laminated multilayer film with a transparent or translucent layer bearing the label graphics and text. The label 320 may be made from polyvinyl chloride (PVC), polyethylene terephthalate (PET), and other similar polymer materials. Known types of voltage testers that are placed on batteries may include thermochromic and electrochromic indicators. In a thermochromic battery tester the indicator may be placed between the anode and cathode electrodes of the battery. The consumer activates the indicator by manually depressing a switch. Once the switch is depressed, the consumer has connected an anode of the battery to a cathode of the battery through the thermochromic tester. The thermochromic tester may include a silver conductor that has a variable width so that the resistance of the conductor also varies along its length. The current generates heat that changes the color of a thermochromic ink display that is over the silver conductor as the current travels through the silver conductor. The thermochromic ink display may be arranged as a gauge to indicate the relative capacity of the battery. The higher the current the more heat is generated and the more the gauge will change to indicate that the battery is good.

EXPERIMENTAL TESTING

Electrolyte Resistance Measurements

Resistance measurements of the electrolyte are conducted in a resistivity cell that is coupled to a potentiostat and frequency response analyzer at various temperatures. The resistivity cell is Model 3403 available from YSI Incorporated that has a cell constant, K, of about 1.0. The cell constant of the resistivity cell may be determined, for example, in accord with G. Jones and B. C. Bradshaw, J. Am. Chem. Sec., 55, 1780 (1933). The frequency response analyzer is a Solartron 1260 with Solartron 1287 Electrochemical Interface software available from Solartron Group. The electrolyte is an aqueous alkaline electrolyte solution consisting of 31% of potassium hydroxide (KOH) by weight of the solution and 2% of zinc oxide (ZnO) by weight of the solution that are dissolved in water. The electrolyte is placed in the resistivity cell within a temperature-controlled chamber and is allowed to reach the measurement temperature over the course of approximately one hour. An impedance sweep from about 100 kHz to about 0.01 Hz is run on the resitivity cell with the electrolyte at temperature. The data resulting from the impedance sweep is analyzed with Z-Plot/Z-View Electrochemical Interface Software available from Scribner Associates, Inc. The electrolyte resistance measurements are completed at a temperature, $t_1$, of about 5° C.; at a temperature, $t_2$, of about 15° C.; at a temperature, $t_3$, of about 30° C.; and at a temperature, $t_4$, of about 40° C. The results of electrolyte resistance measurements, $R_{el-te(t1)}$, $R_{el-te(t2)}$, $R_{el-te(t3)}$ and $R_{el-te(t4)}$, are included in Table 1 below.

Ohmic Resistance Measurements

Ohmic resistance measurements are conducted on assembled batteries of varying designs at various temperatures. A four-point battery contact fixture is coupled to a potentiostat and a frequency response analyzer. The frequency response analyzer is a Solartron 1260 with Solartron 1287 Electrochemical Interface software available from Solartron Group. A battery is inserted into the four-point battery contact fixture within a temperature-controlled chamber and is allowed to reach the measurement temperature over the course of approximately one hour. An impedance sweep from about 60 kHz to about 0.1 Hz is run on the fixture including the battery at temperature. The data resulting from the impedance sweep is analyzed with Z-Plot/Z-View Electrochemical Interface Software available from Scribner Associates, Inc. The ohmic resistance measurement of the battery is measured by applying an AC potential to the battery and then measuring the current through the battery. The impedance is then represented as a complex number composed of a real and an imaginary part. A Nyquist plot includes the real part, on the X-axis, and the imaginary part, on the Y-axis, of the measured impedance. The intercept on the X-axis of the impedance is the value of the ohmic resistance of the battery. The ohmic resistance measurements are completed at a temperature, $t_1$, of about 5° C.; at a temperature, $t_2$, of about 15° C.; at a temperature, $t_3$, of about 30° C.; and at a temperature, $t_4$, of about 40° C. The background resistance of the fixture is subtracted from the ohmic resistance values that are obtained. The results of ohmic resistance measurements, $R_{t1}$, $R_{t2}$, $R_{t3}$, and $R_{t4}$, are included in Table 1 below.

Testing of Assembled AA Alkaline Primary Batteries

A battery, referred to as Battery A in Table 1, is assembled to evaluate the effects of the present invention. The anode includes an anode slurry containing 4.65 grams of zinc; 1.35 cubic centimeters of a potassium hydroxide alkaline electrolyte with about 31% KOH by weight and 2% by ZnO dissolved in water; 0.027 grams of polyacrylic acid gellant; and 0.02 grams of corrosion inhibitor. The cathode includes a blend of EMD, graphite, and potassium hydroxide aqueous electrolyte solution. The cathode includes a loading of 10.74 grams of EMD, and a loading of 0.4 grams Timcal BNB-90 graphite. Battery A also has a cathode-to-anode interfacial area. The cathode-to-anode interfacial surface area of Battery A is 11.253 $cm^2$. A separator, having an outer layer and inner layer, is interposed between the anode and cathode. The outer layer of the separator includes a cellophane laminated to a nonwoven material with a basis weight of about 57 $g/m^2$ and a thickness of about 90 microns (dry). The inner layer of the separator is a nonwoven material with a basis weight of about 25 $g/m^2$ and a thickness of about 110 microns (dry). The anode, cathode, and separator are inserted in a housing that is cylindrical in shape. The housing is then sealed to finish off the battery assembly process. Ohmic resistance of Battery A is then measured as is described above. The results of ohmic resistance measurements, $R_{t1}$, $R_{t2}$, $R_{t3}$, and $R_{t4}$, for Battery A are included in Table 1 below.

Another battery, referred to as Battery B in Table 1, is assembled to evaluate the effects of the present invention. The anode includes an anode slurry containing 4.8 grams of zinc; 1.39 cubic centimeters of a potassium hydroxide alkaline electrolyte with about 31% KOH by weight and 2% by ZnO dissolved in water; 0.027 grams of polyacrylic acid gellant; and 0.02 grams of corrosion inhibitor. The cathode includes a blend of EMD, graphite, and potassium hydroxide aqueous electrolyte solution. The cathode includes a loading of 10.92 grams of EMD, and a loading of 0.4 grams Timcal BNB-90 graphite. Battery B also has a cathode-to-anode interfacial area. The cathode-to-anode interfacial surface area of Battery B is 11.352 $cm^2$. A separator, having an outer layer and inner layer, is interposed between the anode and cathode. The outer layer and the inner layer of the separator both include a nonwoven material separator with a basis weight of about 23 $g/m^2$ and thickness of about 75 microns (dry) The anode, cathode, and separator are inserted in a housing that is cylindrical in shape. The housing is then sealed to finish off the battery assembly process. Ohmic resistance of Battery B is then measured as is described above. The results of ohmic resistance measurements, $R_{t1}$, $R_{t2}$, $R_{t3}$, and $R_{t4}$, for Battery B are included in Table 1 below.

The ratios of the resistances of the electrolyte for all selected temperature combinations are calculated per Equation 6 for Battery A and Battery B. The integrated in-cell electronic resistance, $R_e$, is calculated per Equation 7 for Battery A and Battery B for all selected temperature combinations. The average of each integrated in-cell electronic resistance, $R_e$, is included in Table 1 below. The integrated in-cell ionic resistance, $R_{i(t1)}$, $R_{i(t2)}$, $R_{i(t3)}$, and $R_{i(t4)}$, are calculated per Equation 8 for Battery A and Battery B. The calculated integrated in-cell ionic resistances are included in Table 1 below.

Area-Specific Resistance Measurements

Area-Specific Resistance measurements are conducted in a resistivity cell at room temperature, e.g., about 21° C. The resistivity cell consists of two stainless steel electrodes encased in Teflon®. The lower electrode is constructed such that a small reservoir of electrolyte may be maintained in the cell. The top electrode assembly is removable and is aligned to the bottom assembly via two metal pins. The top electrode assembly is spring loaded so that that force may be applied (approximately 4 to 5 lbs.) to the top of a material sample being analyzed. The lower electrode assembly is screwed to a fixture base and electrical leads are attached to each electrode. The leads are then attached to the leads of an impedance analyzer, such as a Solartron Impedance Analyzer, that is used to complete impedance sweeps to determine resistances of the cell or sample materials.

The background resistance of the resistivity cell is determined by running an impedance sweep on the fixture filled with electrolyte when its electrodes are shorted. The sweep starts at 100,000 kHz and finishes at 100 Hz using a 10 mV amplitude, using the software program ZPlot by Scribner Instruments to control the instrumentation. The resistance of the fixture ($R_{CELL}$) may have typical values between about 10 and 150 mΩ depending upon the condition of the stainless steel electrodes. Several sweeps may be completed to ensure the value obtained is relatively constant.

The resistance of the separator and electrolyte combination is determined by running an impedance sweep on a separator sample. The fixture includes a center disk upon which the separator sample may be placed. Electrolyte is placed within the cavity of the resistivity cell to a level that ensures the separator sample is well-wetted on both sides for 1 minute. The same impedance sweep as described above is run. Again, several sweeps may be completed to ensure the value obtained is relatively consistent. The data obtained from the sweeps is plotted on a Nyquist plot. The ohmic resistance ($R_{REAL}$) of the separator and electrolyte combination is determined at the Z"=0 point on the Nyquist plot. However, this value includes the resistance of the resistivity cell. By subtracting the resistance value of the resistivity cell ($R_{CELL}$) from the resistance determined for the separator and electrolyte combination sample that includes resistivity cell impedance ($R_{REAL}$), one can calculate the adjusted resistance value for the separator and electrolyte combination [$R_{REAL}(ADJ)$].

The area-specific resistance (ASR) of the separator/electrolyte combination is determined by multiplying the geometrical surface area of the resistivity cell's working electrode by the adjusted separator-electrolyte combination's resistance value. The working electrode surface area of resistivity cell used in these experiments is 3.83 cm². The units of ASR are mOhm·cm².

The area-specific resistance for the separator and electrolyte combinations of Battery A and Battery B that are described above are measured. The impedance of the resistivity cell, at room temperature, is first determined with each specific electrolyte as described above. The impedance of the separator/electrolyte combination, at room temperature, is then determined with each specific electrolyte. The adjusted separator/electrolyte combination resistance is then determined and used in the calculation of the ASR. The ASR for Battery A and Battery B is included within Table 1.

Results Discussion

Table 1 includes the data resulting from all analyses that are described above.

TABLE 1

Area-specific resistance (ASR) for separator/electrolyte combinations.

| RESISTANCE | BATTERY A | BATTERY B |
|---|---|---|
| $R_{el-te(t1)}$ (Ω · cm) | 3.153 | 3.006 |
| $R_{el-te(t2)}$ (Ω · cm) | 2.543 | 2.428 |
| $R_{el-te(t3)}$ (Ω · cm) | 1.948 | 1.837 |

TABLE 1-continued

Area-specific resistance (ASR) for separator/electrolyte combinations.

| RESISTANCE | BATTERY A | BATTERY B |
|---|---|---|
| $R_{el-te(t4)}$ (Ω · cm) | 1.685 | 1.594 |
| $R_{t1}$ (Ω) | 0.056 | 0.067 |
| $R_{t2}$ (Ω) | 0.046 | 0.574 |
| $R_{t3}$ (Ω) | 0.035 | 0.486 |
| $R_{t4}$ (Ω) | 0.029 | 0.446 |
| $R_e$ (Ω) | 0.017 | 0.019 |
| $R_{i(t1)}$ (Ω) | 0.056 | 0.047 |
| $R_{i(t2)}$ (Ω) | 0.046 | 0.038 |
| $R_{i(t3)}$ (Ω) | 0.035 | 0.029 |
| $R_{i(t4)}$ (Ω) | 0.029 | 0.025 |
| ASR (mOhm · cm²) | 428 | 326 |
| Cathode-to-Anode Interfacial Area (cm²) | 11.253 | 11.352 |
| $R_{is}$ (Ω) | 0.038 | 0.029 |

The integrated in-cell ionic resistance and the integrated in-cell electronic resistance of both Battery A and Battery B may be extrapolated for any temperature within the range of 0° C. to 40° C. from the data above. For example, the integrated in-cell ionic resistance and the integrated in-cell electronic of Battery A at 22° C. are 0.041Ω and 0.017Ω respectively. In addition, the integrated in-cell ionic resistance and the integrated in-cell electronic of Battery B at 22° C. are 0.034Ω and 0.019Ω respectively. The integrated in-cell ionic resistance at 22° C. is greater than the resistance of the electrolyte within the pores of the separator, $R_{is}$, for both Battery A and Battery B. This may indicate an inefficient dispensing of the anode slurry within the anode volume of both Battery A and Battery B that may create voids within the interface.

The wet thickness of the outer layer of separator for Battery A is about 200 μm. The wet thickness of the inner separator for Battery A is 160 μm. The effective thickness of the separator, $T_{cell}$, in Battery A at 22° C. is 388 μm [(0.041Ω/0.038Ω)·(0.200 μm+0.160 μm)]. The wet thickness of the outer layer of separator for Battery B is about 120 μm. The wet thickness of the inner separator for Battery B is 120 μm. The effective thickness of the separator, $T_{cell}$, in Battery A at 22° C. is 281 μm [(0.034Ω/0.029Ω)·(0.120 μm+0.120 μm)]. The effective thickness of the separator for Battery A and Battery B is greater than the wet thickness of the separator for Battery A and Battery B. This may also indicate an inefficient dispensing of the anode slurry within the anode volume of both Battery A and Battery B that may create voids within the interface.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A primary AA alkaline battery comprising:
   an anode, the anode comprising an electrochemically active anode material;
   a cathode, the cathode comprising an electrochemically active cathode material;
   an electrolyte, the electrolyte comprising potassium hydroxide;
   a separator therebetween the anode and the cathode; and
   an integrated in-cell ionic resistance (Ri) at 22 ° C. of less than about 39 mΩ;
   wherein the electrochemically active anode material comprises zinc, the zinc having an anode loading from about 3.3 grams of zinc to about 5.5 grams of zinc.

2. The primary AA battery of claim 1, wherein the anode loading is from about 4.0 grams of zinc to about 5.5 grams of zinc.

3. The primary AA battery of claim 1, wherein the anode loading is from about 4.3 grams of zinc to about 5.5 grams of zinc.

4. The primary AA battery of claim 1, wherein the anode loading is from about 4.6 grams of zinc to about 5.5 grams of zinc.

5. The primary AA alkaline battery of claim 1, the integrated in-cell electronic resistance (Re) at 22 ° C. being less than about 22 mΩ.

6. The primary AA alkaline battery of claim 1, the primary AA alkaline battery further comprising an ohmic resistance (Rt) at 22 ° C. of less than about 57 mΩ.

7. The primary AA alkaline battery of claim 1, wherein the electrochemically active cathode material comprises an electrochemically active material selected from the group consisting of manganese oxide, manganese dioxide, electrolytic manganese dioxide (EMD), chemical manganese dioxide (CMD), high power electrolytic manganese dioxide (HP EMD), lambda manganese dioxide, gamma manganese dioxide, beta manganese dioxide, and mixtures thereof.

8. The primary AA alkaline battery of claim 1, wherein the electrochemically active cathode material comprises an electrochemically active material selected from the group consisting of silver oxide, nickel oxide, nickel oxyhydroxide, copper oxide, copper salts, bismuth oxide, high-valence nickel compound, high-valence iron compound, and mixtures thereof.

9. The primary AA alkaline battery of claim 1, wherein the electrochemically active cathode material comprises electrolytic manganese dioxide.

10. The primary AA alkaline battery of claim 9, the electrolytic manganese dioxide having a BET surface area from about 22 m2/g to about 32 m2/g.

11. The primary AA alkaline battery of claim 1, the cathode comprising a carbon additive, the carbon additive comprising from about 3.25 weight percent to about 4.25 weight percent of the cathode.

12. The primary AA alkaline battery of claim 1, the separator comprising a density from about 1.33 g/cm3 to about 1.37 g/cm3.

13. The primary AA alkaline battery of claim 1, the zinc having a particle size from about 10 μm to about 300 μm.

14. The primary AA alkaline battery of claim 13, the zinc having a BET surface area from about 0.045 m2/g to about 0.055 m2/g.

15. The primary AA alkaline battery of claim 1, wherein the separator has a porosity of greater than 70%.

* * * * *